United States Patent
Kim et al.

(10) Patent No.: US 7,239,767 B2
(45) Date of Patent: Jul. 3, 2007

(54) PACKAGING APPARATUS FOR OPTICAL INTERCONNECTION ON OPTICAL PRINTED CIRCUIT BOARD

(75) Inventors: Dong-Su Kim, Anyang-si (KR);
Hyo-Hoon Park, Daejeon (KR);
Han-Seo Cho, Daejeon (KR);
Byung-Sup Rho, Daejeon (KR);
Sun-Tae Jung, Anyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 242 days.

(21) Appl. No.: 10/795,612

(22) Filed: Mar. 8, 2004

(65) Prior Publication Data
US 2005/0100264 A1    May 12, 2005

(30) Foreign Application Priority Data
Nov. 11, 2003    (KR) ............ 10-2003-0079543

(51) Int. Cl.
*G02B 6/12* (2006.01)
(52) U.S. Cl. ............ 385/14; 385/32; 385/49; 385/88
(58) Field of Classification Search ............ 385/10, 385/14, 16, 24, 128, 145, 147, 31, 40, 49–51, 385/88–92
See application file for complete search history.

(56) References Cited

U.S. PATENT DOCUMENTS

| | | | | |
|---|---|---|---|---|
| 6,470,117 B1 * | 10/2002 | Tang et al. | .................... | 385/43 |
| 6,503,831 B2 * | 1/2003 | Speakman | .................... | 438/674 |
| 6,512,861 B2 * | 1/2003 | Chakravorty et al. | ......... | 385/14 |
| 6,516,104 B1 * | 2/2003 | Furuyama | ..................... | 385/14 |
| 6,792,179 B2 * | 9/2004 | Lu et al. | ........................ | 385/33 |
| 6,804,423 B2 * | 10/2004 | Tsukamoto et al. | ........... | 385/14 |
| 6,885,788 B2 * | 4/2005 | Iwaki et al. | ................... | 385/15 |
| 2002/0015562 A1 * | 2/2002 | Kikuchi et al. | ............... | 385/47 |
| 2003/0007745 A1 * | 1/2003 | Martwick | ...................... | 385/88 |
| 2003/0185484 A1 * | 10/2003 | Chakravorty et al. | ......... | 385/14 |

FOREIGN PATENT DOCUMENTS
KR    20030007311    *    1/2003

* cited by examiner

*Primary Examiner*—Hemang Sanghavi
(74) *Attorney, Agent, or Firm*—Cha & Reiter, L.L.C.

(57) ABSTRACT

A packaging apparatus for optical interconnection on an optical PCB includes a first substrate with a via hole formed therethrough and in which an optical waveguide is formed, an optical interconnection block having a reflective plane on its lower end inserted into the via hole, a second substrate flip-bonded to an upper surface of the first substrate, and an optically active element flip-bonded to a lower surface of the second substrate and aligned for optical communication.

25 Claims, 7 Drawing Sheets

PACKAGING APPARATUS FOR OPTICAL INTERCONNECTION ON OPTICAL PRINTED CIRCUIT BOARD

CLAIM OF PRIORITY

This application claims priority to an application entitled "PACKAGING APPARATUS FOR OPTICAL INTERCONNECTION ON OPTICAL PRINTED CIRCUIT BOARD," filed in the Korean Intellectual Property Office on Nov. 11, 2003 and assigned Serial No. 2003-79543, the contents of which are hereby incorporated by reference.

BACKGROUND OF THE INVENTION

1. Field of the Invention

The present invention relates to a packaging apparatus for optical interconnection, and more particularly to a packaging apparatus for optical interconnection on an optical PCB, in which an optically active element (such as a semiconductor laser, a photo diode, etc.) is mounted on a printed circuit board (hereinafter, referred to as an "optical PCB") provided with an optical waveguide.

2. Description of the Related Art

In the simplest structure of packaging apparatus for optical interconnection on an optical PCB, which is well known to those skilled in the art, metal pads and solder bumps are located adjacent to an optical via hole formed through the PCB, and an optically active element is mounted on the PCB by a flip-bonding method.

U.S. Pat. No. 6,512,861, entitled "PACKAGING AND ASSEMBLY METHOD FOR OPTICAL COUPLING," to Kishore K., Chakravorty, et al., discloses a structure in which a BGA (Ball Grid Array) package, obtained by flip-bonding a surface emitting laser to a BGA substrate is mounted on the printed circuit board. The BGA substrate is provided with a through hole serving as a route for passing an optical signal in order to integrate an optically active element onto a printed circuit board including an optical waveguide.

Another known structure in which a surface emitting laser is bonded to an electrical substrate, is then vertically mounted in a printed circuit board so that an optical signal outputted from the surface emitting laser is directly incident on an optical waveguide of the printed circuit board.

In the simplest structure, in which the optically active element is directly flip-bonded to the printed circuit board, the optically active element has a relatively small size compared to the diameter of the solder balls and the size of the metal pads on the printed circuit board, manufactured by a conventional process, thus causing difficulty in precisely integrating the optically active element onto the printed circuit board.

In the BGA structure, since the BGA substrate is manufactured by a conventional process for manufacturing the printed circuit board, it is difficult to form the through hole at a precise location on the BGA substrate and to mount an optically active element on the BGA substrate. Also, since an optical signal emitted from the surface emitting laser is spread outwardly due to the thickness of the BGA substrate, the BGA package requires a micro lens separately installed on a lower end of the BGA substrate.

In the structure in which the surface emitting laser is vertically installed in the PCB, it is difficult to electrically connect to the surface emitting laser transmitting and receiving chips, which must be exposed through the printed circuit board so as to emit heat.

SUMMARY OF THE INVENTION

The present invention has been made in view of the above problems, and it is an object of the present invention to provide a packaging apparatus for optical interconnection on an optical PCB, which is manufactured by a simple process.

In accordance with a first aspect of the present invention, the above and other objects can be accomplished by the provision of a packaging apparatus for optical interconnection on an optical PCB includes a printed circuit board having an optical via hole and an upper surface and in which an optical waveguide is formed. Further included is an optical interconnection block having a lower end on which is provided a reflective plane, the block being inserted into the optical via hole. The apparatus also has a package substrate mounted on the upper surface, the substrate having a lower surface. In addition, the apparatus includes an optically active element flip-bonded to the lower surface and optically aligned, by the reflective plane, for optical communication by means of the optical waveguide.

In accordance with a second aspect of the present invention, there is provided a packaging apparatus for optical interconnection on an optical PCB comprising: a printed circuit board in which an optical waveguide is formed, the board having an upper surface, a main via hole, and subsidiary via holes arranged around the main via hole. The apparatus further includes an optical interconnection block having a lower end on which is provided a reflective plane, the block being inserted into the main optical via hole. A package substrate is mounted on the upper surface, the substrate having a lower surface. The apparatus has a plurality of guide pins extended from the package substrate and inserted into the subsidiary via holes. An optically active element is flip-bonded to said lower surface and optically aligned, by the reflective plane, for optical communication by means of the optical waveguide.

In accordance with a third aspect of the present invention, there is provided a packaging apparatus for optical interconnection on an optical PCB includes a printed circuit board having an optical via hole and an upper surface and in which an optical waveguide is formed. Further included is an optical interconnection block having a lower end on which is provided a reflective plane, the block being inserted into the optical via hole. The apparatus has a package substrate mounted on said upper surface, the substrate having an upper surface and being made of a transparent material. An optically active element is flip-bonded to the upper surface of the package substrate and optically aligned, by the reflective plane, for optical communication by means of the optical waveguide.

In accordance with a fourth aspect of the present invention, there is provided a packaging apparatus for optical interconnection on an optical PCB includes a printed circuit board in which an optical waveguide is formed, the board having an upper surface, a main via hole, and subsidiary via holes arranged around the main via hole. The apparatus further includes an optical interconnection block having a lower end on which is provided a reflective plane, the block being inserted into the main optical via hole. A package substrate is mounted on the upper surface, the substrate having an upper surface. A plurality of guide pins extend from the package substrate and are inserted into the subsidiary via holes. An optically active element is flip-bonded to the upper surface of the package substrate and optically aligned, by the reflective plane, for optical communication by means of the optical waveguide.

In accordance with a fifth aspect of the present invention, there is provided a packaging apparatus for optical interconnection on an optical PCB includes a printed circuit board having an optical via hole and an upper surface and in which an optical waveguide is formed. The apparatus features a package substrate flip-bonded to the upper surface and having a lower surface. An optically active element is flip-bonded to the lower surface and is provided with an active layer optically aligned for optical communication by means of the optical waveguide.

Preferably, the optically active element includes at least one of a surface emitting element, a side emitting element and a surface receiving element.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention are described below in detail with reference to the annexed drawings. In the following description of the present invention, detailed description of known functions and configurations is omitted for clarity of presentation.

Figure 1:
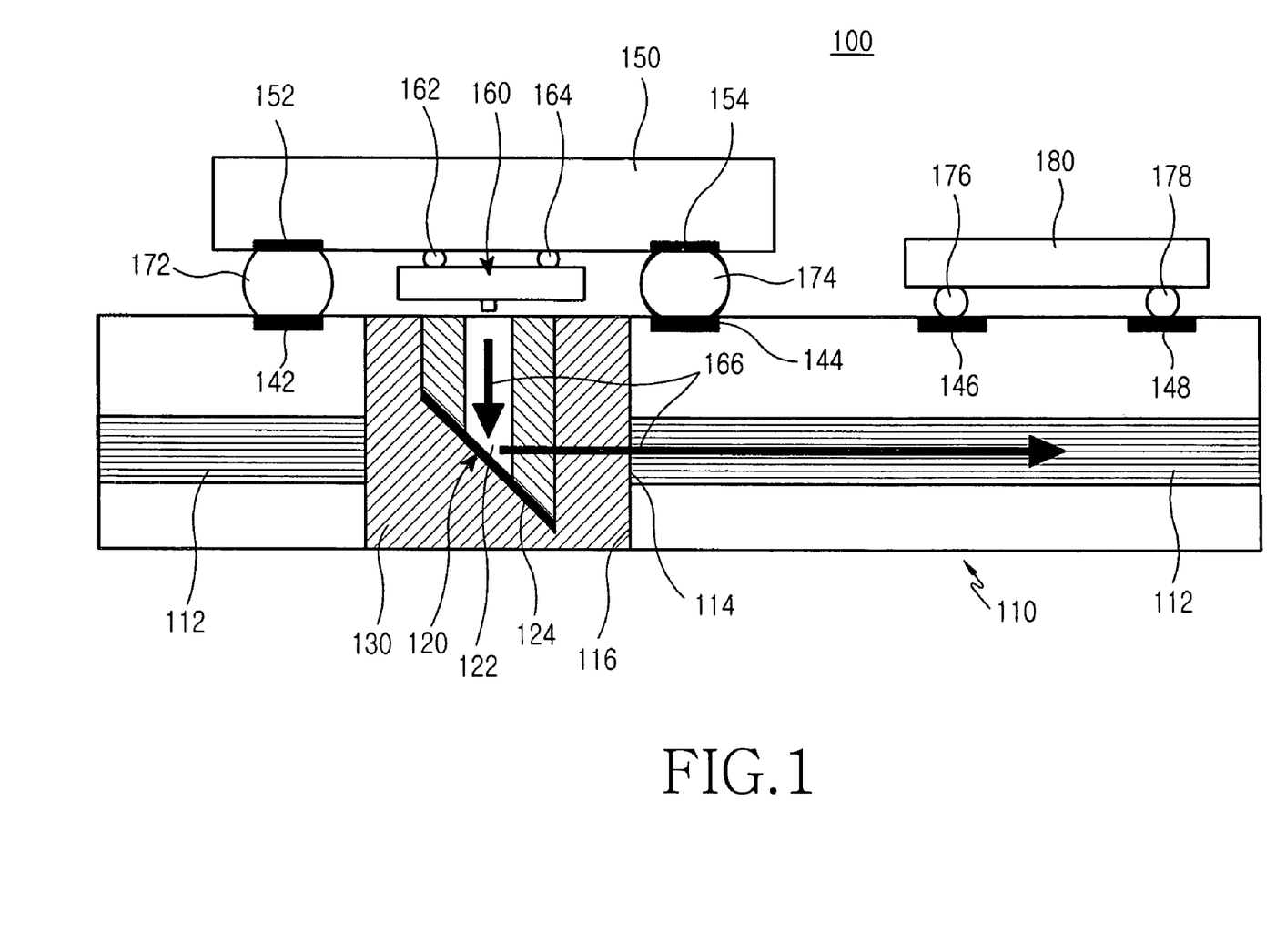
FIG. 1 is a cross-sectional view of a packaging apparatus for optical interconnection on an optical PCB in accordance with a first preferred embodiment of the present invention.

FIG. 1 is a cross-sectional view of a packaging apparatus for optical interconnection on an optical PCB in accordance with a first preferred embodiment of the present invention. The apparatus 100 comprises a printed circuit board 110, an optical interconnection block 120, a package substrate 150, a surface emitting element 160, and a transmitting chip 180.

The printed circuit board 110 includes an optical waveguide 112 therein, and an optical via hole 116 contacting the optical waveguide. The optical waveguide 112 has a stacked structure in the printed circuit board 110, and serves as a route by which an optical signal is transmitted. The printed circuit board 110 includes a plurality of metal pads 142–148 formed on an upper surface thereof.

The optical interconnection block 120 is inserted into the optical via hole 116 whose inside is filled with a transparent filler 130. The optical interconnection block 120 has a hollow-cylindrical structure including a cavity 122 therein and a reflective plane 124 formed on a lower end thereof, which is sloped at a designated angle. The reflective plane 124 serves to reflect an optical signal incident thereon from the upper end of the optical interconnection block 120 to an input terminal 114 of the optical waveguide 112.

The package substrate 150 includes a plurality of metal pads 152, 154 formed on a lower surface thereof. Solder balls 172, 174 are interposed between corresponding pairs 142, 152 and 144, 154 of the metal pads between the printed circuit board 110 and the package substrate 150. The package substrate 150 is mounted on an upper surface of the printed circuit board 110 using the solder balls 172, 174. The package substrate 150 is electrically connected to the printed circuit board 110 using the solder balls 172 and 174. The package substrate 150 includes a conventional semiconductor substrate, a substrate for integrating a BGA optical element, a substrate for integrating a CSP (Chip Scale Package) optical element, and a substrate for a PGA (Pin Grid Array).

The surface emitting element 160 is flip-bonded to the lower surface of the package substrate 150 using solder bumps 162, 164. The surface emitting element 160 is aligned with the optical interconnection block 120 by surface tension generated by reflowing the solder balls 172, 174 interposed between the package substrate 150 and the printed circuit board 110. The surface emitting element 160 is electrically connected to the package substrate 150 by means of the solder bumps 162, 164.

The transmitting chip 180 is mounted on the upper surface of the printed circuit board 110 using solder balls 176, 178 laid on metal pads 146, 148 on the printed circuit board. The transmitting chip 180 is electrically connected to the printed circuit board 110 by means of the solder balls 176, 178. The transmitting chip 180 may be mounted on the upper surface of the printed circuit board 110 by conventional SMT (Surface Mounting Technology). However, in this embodiment of the present invention, the transmitting chip 180 is mounted on the upper surface of the printed circuit board 110 using the solder balls 176, 178.

The surface emitting element 160 driven by the transmitting chip 180 emits an optical signal downward, and the optical signal is reflected by the reflective plane 124 of the optical interconnection block 120 and directed toward the input terminal 114 of the optical waveguide 112. The reflected optical signal progresses forward in the optical waveguide 112.

In this embodiment of the present invention, the packaging apparatus 100 serves to transmit an optical signal. However, the packaging apparatus 100 may serve to receive an optical signal. In the latter case, the packaging apparatus 100 has the same structure, but comprises a surface receiving element, such as a photo diode, instead of the surface emitting element 160, and a receiving chip instead of the transmitting chip 180. The above structure may be applied to later-described other embodiments of the present invention.

Figure 2:
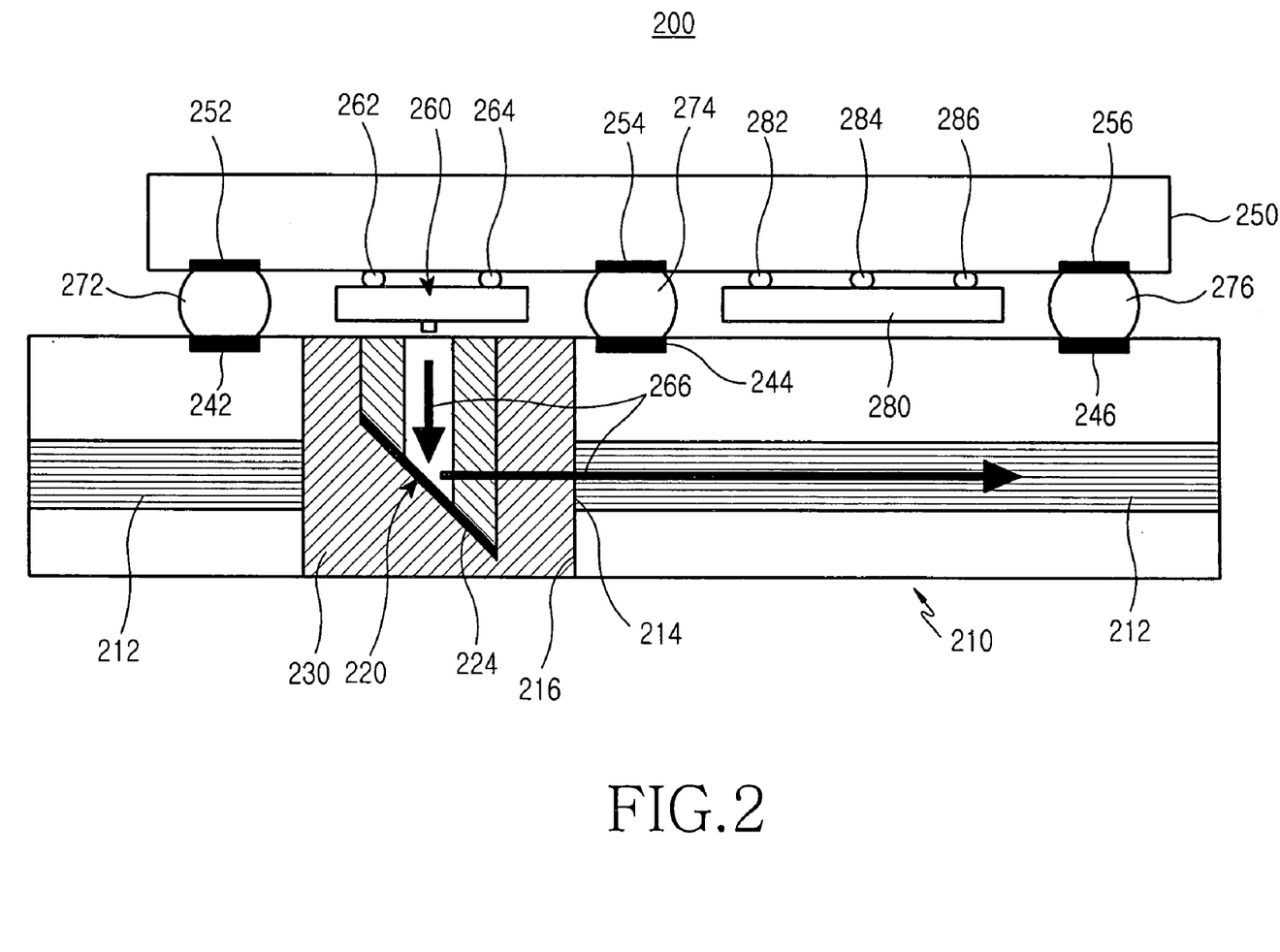
FIG. 2 is a cross-sectional view of a packaging apparatus for optical interconnection on an optical PCB in accordance with a second preferred embodiment of the present invention.

FIG. 2 is a cross-sectional view of a packaging apparatus for optical interconnection on an optical PCB in accordance with a second preferred embodiment of the present invention. The apparatus 200 comprises a printed circuit board 210, an optical interconnection block 220, a package substrate 250, a surface emitting element 260, and a transmitting chip 280. The apparatus 200 has a structure similar to that of the apparatus 100 as shown in FIG. 1, but the transmitting chip 280 is mounted on a lower surface of the package substrate 250 by means of solder bumps 282–286 rather than on the upper surface of the printed circuit board 210. Hereinafter, detailed description is omitted for a part of the construction and operation of some components in the second embodiment that is substantially the same as that of the first embodiment.

The printed circuit board 210 includes an optical waveguide 212 formed therein, and an optical via hole 216 contacting the optical waveguide 212. The optical waveguide 212 has a stacked structure in the printed circuit board 210, and serves as a route by which an optical signal is transmitted. The printed circuit board 210 includes a plurality of metal pads 242–246 formed on an upper surface thereof.

The optical interconnection block 220 is inserted into the optical via hole 216, and the inside of the optical via hole 216 is filled with a transparent filler 230. The optical interconnection block 220 has a hollow-cylindrical structure including a cavity therein and a reflective plane 224 formed on a lower end, which is sloped at a designated angle. The reflective plane 224 serves to reflect an optical signal incident thereon from the upper end of the optical interconnection block 220 to an input terminal 214 of the optical waveguide 212.

The package substrate 250 has a plurality of metal pads 252–256 formed on its lower surface. Solder balls 272–276 are interposed between corresponding pairs 242/252, 244/254, 246/256 of the metal pads between the printed circuit board 210 and the package substrate 250. The package substrate 250 is mounted on an upper surface of the printed circuit board 210 using the solder balls 272–276 which electrically connect the printed circuit board to the package substrate.

The surface emitting element 260 is flip-bonded to the lower surface of the package substrate 250 using solder bumps 262, 264 which electrically connect the surface emitting element to the package substrate.

The transmitting chip 280 is mounted on the lower surface of the package substrate 250 using the solder bumps 282, 286 which electrically connect the transmitting chip to the package substrate.

The surface emitting element 260 driven by the transmitting chip 280 emits an optical signal downward. The optical signal is reflected by the reflective plane 224 of the optical interconnection block 220 and is directed toward the input terminal 214 of the optical waveguide 212. The reflected optical signal progresses forward in the optical waveguide 212.

Figure 3:
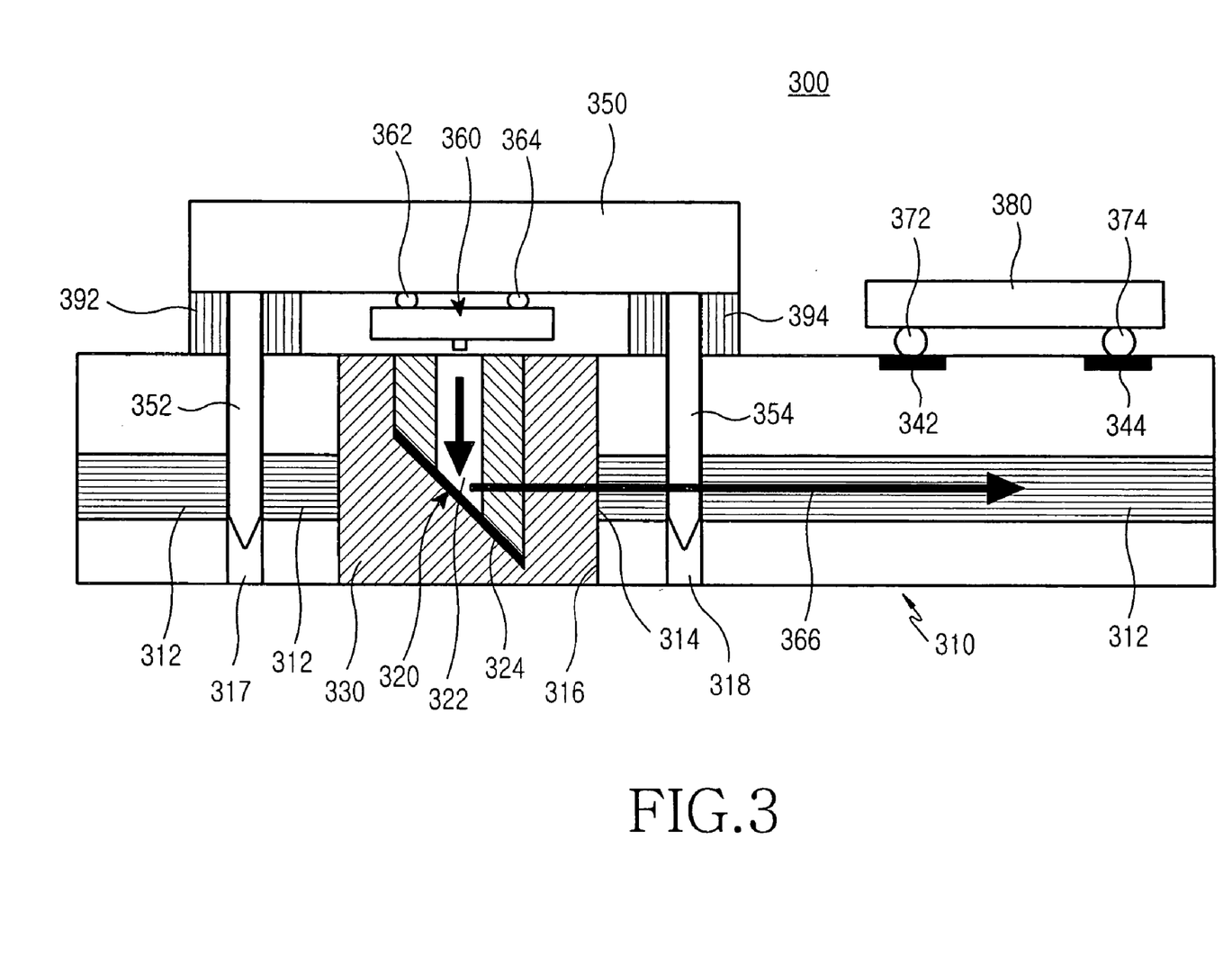
FIG. 3 is a cross-sectional view of a packaging apparatus for optical interconnection on an optical PCB in accordance with a third preferred embodiment of the present invention.

FIG. 3 is a cross-sectional view of a packaging apparatus for optical interconnection on an optical PCB in accordance with a third preferred embodiment of the present invention. The apparatus 300 comprises a printed circuit board 310, an optical interconnection block 320, a package substrate 350, interposers 392, 394, a surface emitting element 360, and a transmitting chip 380. The apparatus 300 has a structure similar to that of the apparatus 100 as shown in FIG. 1. Hereinafter, detailed description is omitted for a part of the construction and operation of some components in the third embodiment that is substantially the same as that of the first embodiment.

The printed circuit board 310 includes an optical waveguide 312 formed therein, a main optical via hole 316 contacting the optical waveguide, and a plurality of subsidiary optical via holes 317, 318 arranged around the main optical via hole. The optical waveguide 312 has a stacked structure in the printed circuit board 310, and serves as a route for transmitting an optical signal. The printed circuit board 310 includes a plurality of metal pads 342, 344 formed on its upper surface.

The optical interconnection block 320 is inserted into the main optical via hole 316, and the inside of the main optical via hole is filled with a transparent filler 330. The optical interconnection block 320 has a hollow-cylindrical structure surrounding a cavity 322. A reflective plane 324 formed on its lower end is sloped at a designated angle. The reflective plane 324 serves to reflect an optical signal incident thereon from the upper end of the optical interconnection block 320 to an input terminal 314 of the optical waveguide 312.

The package substrate 350 includes a plurality of metal guide pins 352, 354 extending downwardly. The package substrate 350 is mounted on the printed circuit board 310 by inserting the metal guide pins 352, 354 into the subsidiary optical via holes 317, 318. The metal guide pins 352, 354 serve to electrically connect the package substrate 350 to the printed circuit board 310.

The interposers 392, 394 are interposed between the package substrate 350 and the printed circuit board 310 so as control an intervening interval. Each of the interposers 392, 394 has a hollow-cylindrical shape such that the corresponding one of the metal guide pins 317, 318 passes through each of cavities of the interposers 392, 394.

The surface emitting element 360 is flip-bonded to the lower surface of the package substrate 350 using solder bumps 362, 364 which electrically connect the surface emitting element to the package substrate.

The transmitting chip 380 is mounted on the upper surface of the printed circuit board 310 by laying solder bumps 372, 374 onto the metal pads 342, 344 on the printed circuit board 310. The transmitting chip 380 is electrically connected to the printed circuit board 310 by means of the solder bumps 372, 374.

The surface emitting element 360 driven by the transmitting chip 380 emits an optical signal downward. The optical signal is reflected by the reflective plane 324 of the optical interconnection block 320, is directed toward the input terminal 314 of the optical waveguide 312 and progresses forward in the optical waveguide.

Figure 4:
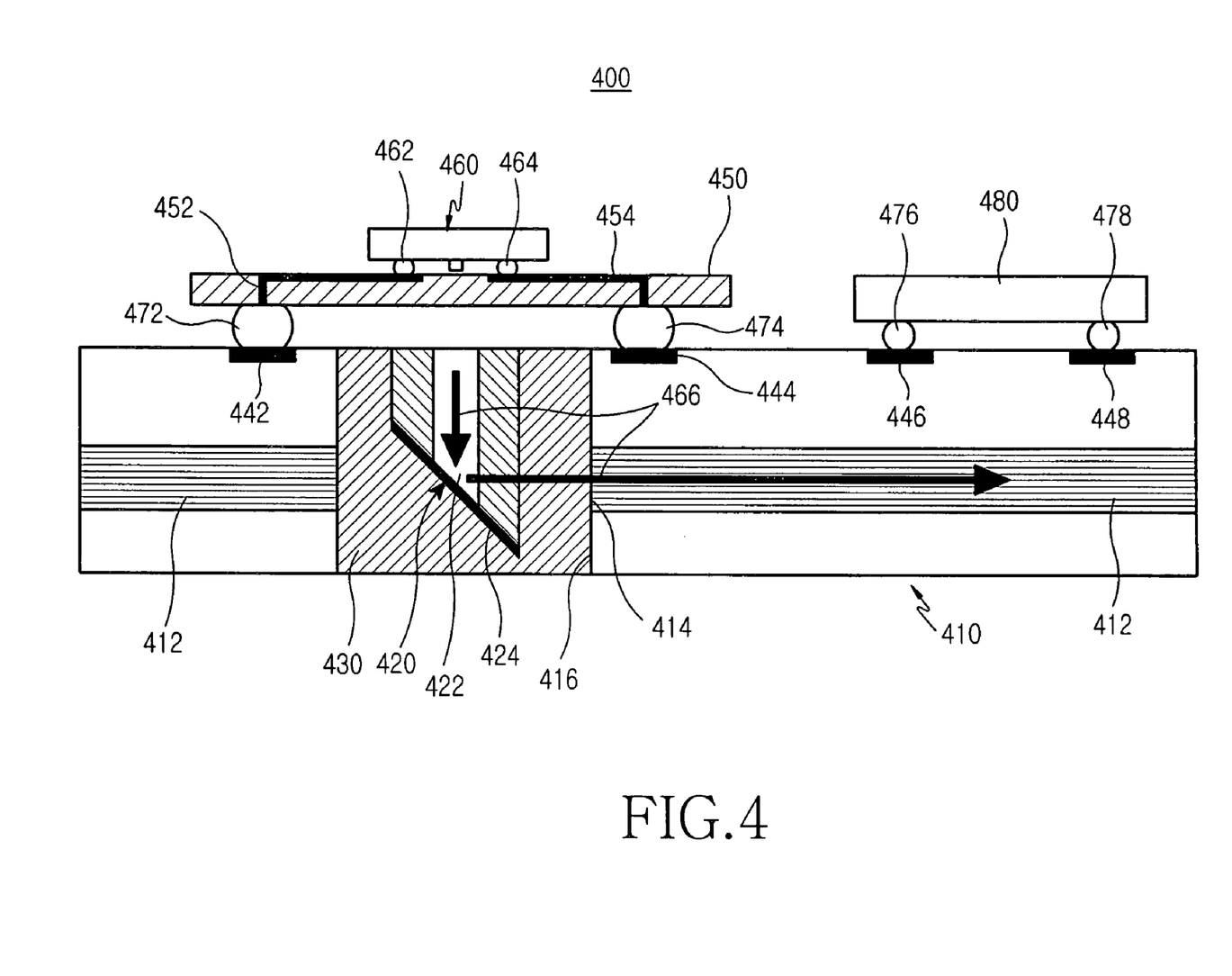
FIG. 4 is a cross-sectional view of a packaging apparatus for optical interconnection on an optical PCB in accordance with a fourth preferred embodiment of the present invention.

FIG. 4 is a cross-sectional view of a packaging apparatus for optical interconnection on an optical PCB in accordance with a fourth preferred embodiment of the present invention. The apparatus 400 comprises a printed circuit board 410, an optical interconnection block 420, a package substrate 450, a surface emitting element 460, and a transmitting chip 480. The apparatus 400 has a structure similar to that of the apparatus 100 as shown in FIG. 1. Hereinafter, detailed description is omitted of a part of the construction and operation of some components in the fourth embodiment that is substantially the same as that of the first embodiment.

The printed circuit board 410 includes an optical waveguide 412 formed therein, and an optical via hole 416 contacting the optical waveguide. The optical waveguide 412 has a stacked structure in the printed circuit board 410, and serves as a route for transmitting an optical signal. The printed circuit board 410 includes a plurality of metal pads 448 formed on its upper surface.

The optical interconnection block 420 is inserted into the optical via hole 416, and the inside of the optical via hole is filled with a transparent filler 430. The optical interconnection block 420 has a hollow-cylindrical structure surrounding a cavity 422. A reflective plane 424 formed on its lower end is sloped at a designated angle. The reflective plane 424 serves to reflect an optical signal incident thereon from the upper end of the optical interconnection block 420 to an input terminal 414 of the optical waveguide 412.

The package substrate 450 is made of a transparent material, and is mounted on the upper surface of the printed circuit board 410 by means of solder balls 472, 474 laid on metal pads 442, 444 on the printed circuit board. The package substrate 450 may be a transparent glass substrate. Electric wires 452, 454 for electrically connecting the surface emitting element 460 and the printed circuit board 410 are buried under the package substrate 450 such that both ends of each of the electric wires 452, 454 are exposed respectively to upper and lower surfaces of the package substrate. The lower ends of the electric wires 452, 454 contact the solder balls 472, 474, respectively.

The surface emitting element 460 is flip-bonded to the upper surface of the package substrate 450 by means of the solder bumps 462, 464. The electric wires 452, 454 contact the solder bumps 462, 464, thereby electrically connecting the surface emitting element 460 to the printed circuit board 410 by means of the solder bumps and the solder balls 472, 474.

The transmitting chip 480 is mounted on the upper surface of the printed circuit board 410 by laying solder balls 476, 478 respectively onto metal pads 446, 448 on the printed circuit board. The transmitting chip 480 is electrically connected to the printed circuit board 410 by means of the solder balls 476, 478.

Figure 5:
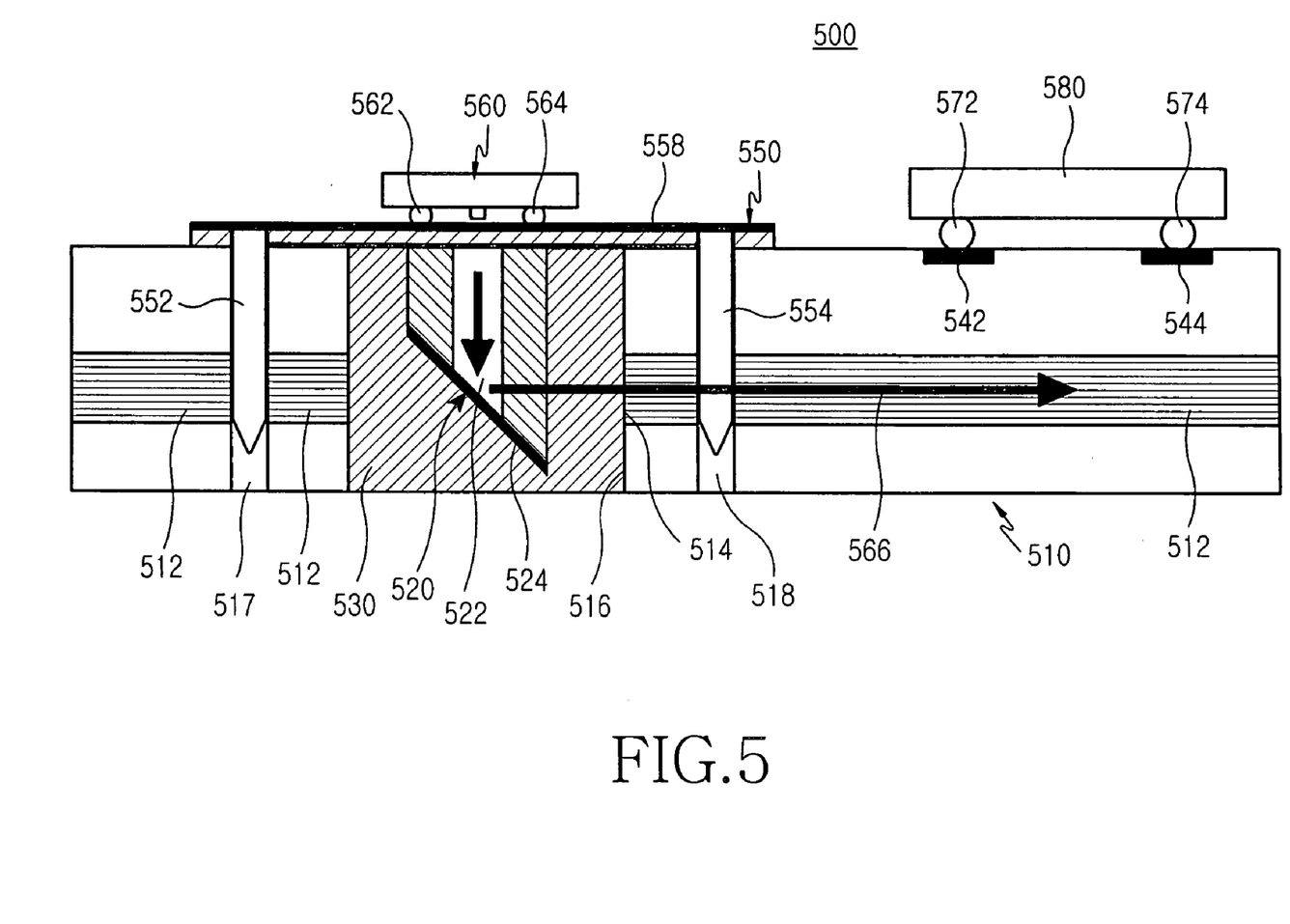
FIG. 5 is a cross-sectional view of a packaging apparatus for optical interconnection on an optical PCB in accordance with a fifth preferred embodiment of the present invention.

FIG. 5 is a cross-sectional view of a packaging apparatus for optical interconnection on an optical PCB in accordance with a fifth preferred embodiment of the present invention. The apparatus 500 comprises a printed circuit board 510, an optical interconnection block 520, a package substrate 550, a surface emitting element 560, and a transmitting chip 580. The apparatus 500 has a structure similar to that of the apparatus 400 as shown in FIG. 4. Hereinafter, detailed description is omitted of a part of the construction and operation of some components in the fifth embodiment that is substantially the same as that of the fourth embodiment.

The printed circuit board 510 includes an optical waveguide 512 formed therein, a main optical via hole 516 contacting the optical waveguide 512, and a plurality of subsidiary optical via holes 517, 518 arranged around the main optical via hole. The optical waveguide 512 has a stacked structure in the printed circuit board 510, and serves as a route by which an optical signal is transmitted. The printed circuit board 510 includes a plurality of metal pads 542, 544 formed on its upper surface.

The optical interconnection block 520 is inserted into the main optical via hole 516, and the inside of the main optical via hole is filled with a transparent filler 530. The optical interconnection block 520 has a hollow-cylindrical structure surrounding a cavity 522, and has a reflective plane 524 formed on its lower end which is sloped at a designated angle. The reflective plane 524 serves to reflect an optical signal incident thereon from the upper end of the optical interconnection block 520 to an input terminal 514 of the optical waveguide 512.

The package substrate 550 is made of a transparent material, and includes a plurality of extending metal guide pins 552, 554. The package substrate 550 is mounted on the printed circuit board 510 by inserting the metal guide pins 552, 554 into the subsidiary optical via holes 517, 518. An electric wire 558 formed on the upper surface of the package substrate 550 contacts a plurality of the metal guide pins 552, 554 which electrically connect the package substrate to the printed circuit board.

The surface emitting element 560 is flip-bonded to the upper surface of the package substrate 550 using solder bumps 562, 564. The electric wire 558 contacts the solder bumps 562, 564, thereby electrically connecting the surface emitting element 560 to the printed circuit board 510 by means of the solder bumps and the metal guide pins 552, 554.

The transmitting chip 580 is mounted onto the upper surface of the printed circuit board 510 using solder balls 572, 574 which are laid respectively onto the metal pads 542, 544 on the printed circuit board. The transmitting chip 580 is electrically connected to the printed circuit board 510 by means of the solder balls 572, 574.

Figure 6:
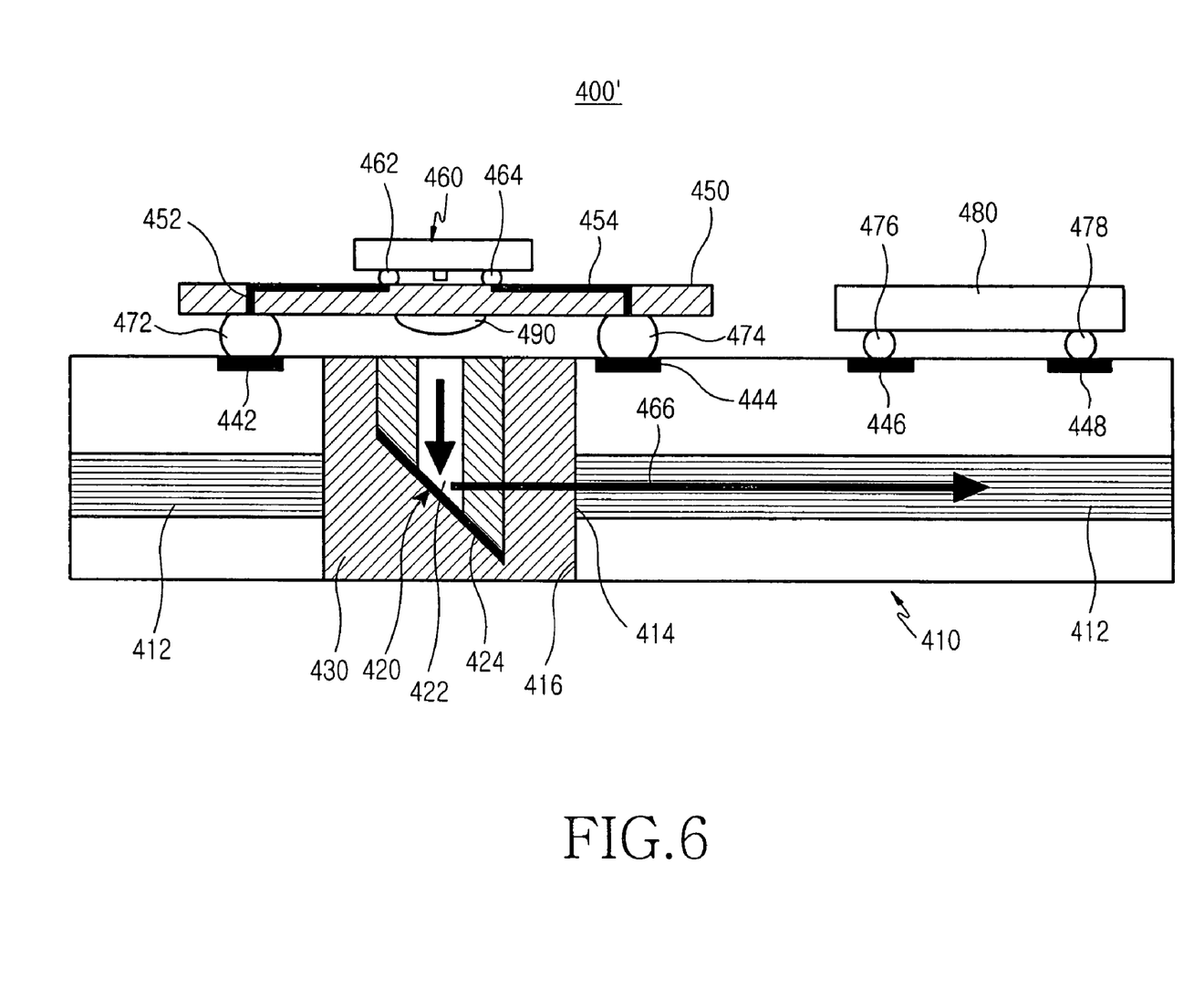
FIG. 6 is a cross-sectional view of a packaging apparatus for optical interconnection on an optical PCB in accordance with a sixth preferred embodiment of the present invention.

FIG. 6 is a cross-sectional view of a packaging apparatus for optical interconnection on an optical PCB in accordance with a sixth preferred embodiment of the present invention. The apparatus 400' comprises a printed circuit board 410, an optical interconnection block 420, a package substrate 450, a condensing lens 490, a surface emitting element 460, and a transmitting chip 480. The apparatus 400' has a structure similar to that of the apparatus 400 as shown in FIG. 4. Hereinafter, detailed description is omitted of a part of the construction and operation of some components in the sixth embodiment that is substantially the same as that of the fourth embodiment.

The condensing lens 490 is bonded to the lower surface of the package substrate 450 in order to improve optical coupling efficiency and reduce allowable alignment tolerance. The condensing lens 490 is aligned such that it is located on a traveling route of an optical signal outputted from the surface emitting element 460. The surface emitting element 460 driven by the transmitting chip 480 emits an optical signal downward. The optical signal penetrates the package substrate 450 and is incident on the condensing lens 490. The condensing lens 490 serves to condense the optical signal. The condensed optical signal is reflected by the reflective plane 424 of the optical interconnection block 420, is directed toward an input terminal 414 of the optical waveguide 412, and progresses forward in the optical waveguide.

Figure 7:
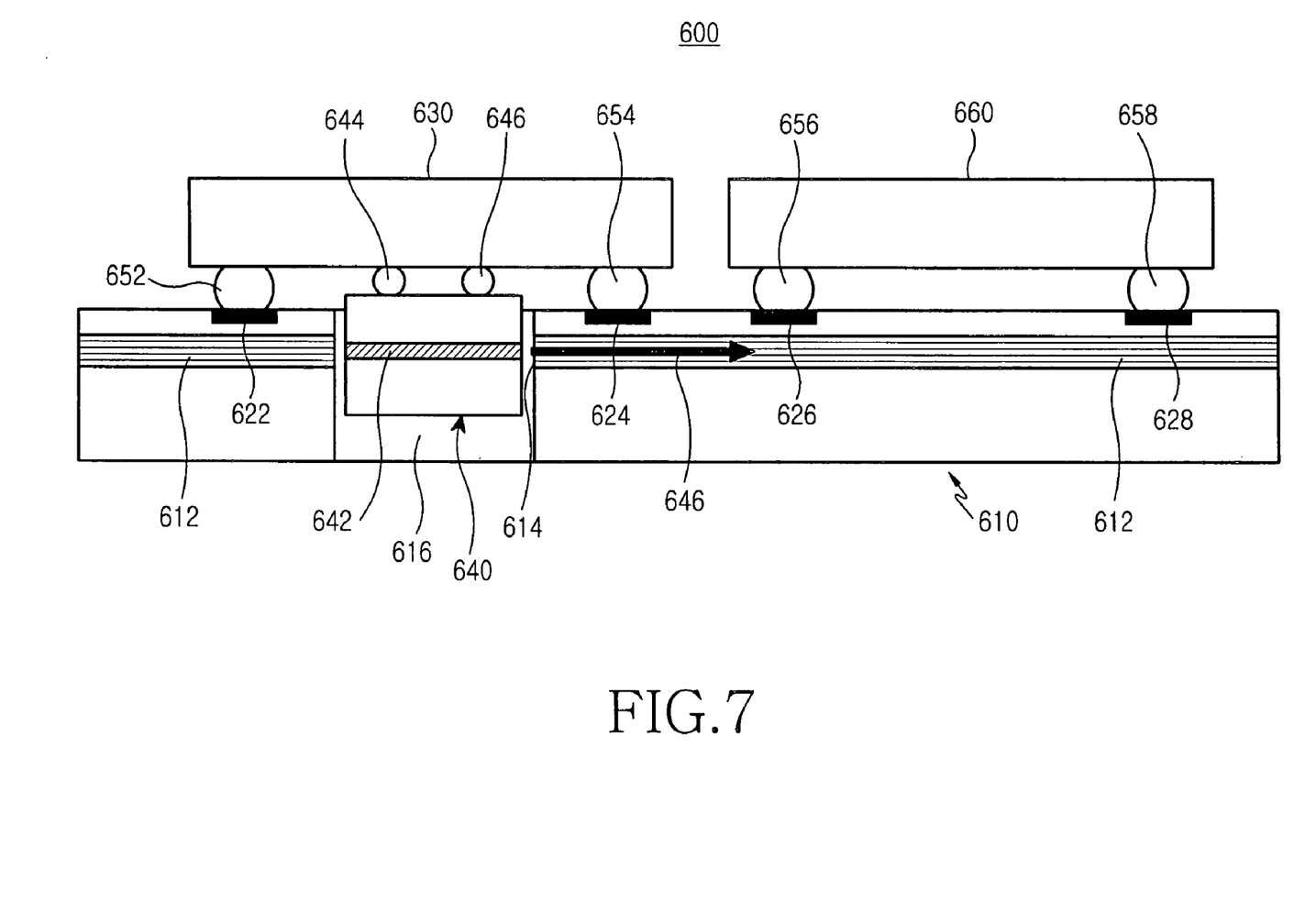
FIG. 7 is a cross-sectional view of a packaging apparatus for optical interconnection on an optical PCB in accordance with a seventh preferred embodiment of the present invention.

FIG. 7 is a cross-sectional view of a packaging apparatus for optical interconnection on an optical PCB in accordance with a seventh preferred embodiment of the present invention. The apparatus 600 comprises a printed circuit board 610, a package substrate 630, a side emitting element 640, and a transmitting chip 660. The apparatus 600 has a structure similar to that of the apparatus 100 as shown in FIG. 1. Hereinafter, detailed description is omitted of a part of the construction and operation of some components in the seventh embodiment that is substantially the same as that of the first embodiment.

The printed circuit board 610 includes an optical waveguide 612 formed therein, and an optical via hole 616 contacting the optical waveguide 612. The optical waveguide 612 has a stacked structure in the printed circuit board 610, and serves as a route by which an optical signal is transmitted. The printed circuit board 610 includes a plurality of metal pads 622–628 formed on its upper surface.

The package substrate 630 is mounted on the upper surface of the printed circuit board 610 by means of solder balls 652, 654 laid respectively onto metal pads 622, 624 on the printed circuit board 610. The package substrate 630 is electrically connected to the printed circuit board 610 by means of the solder balls.

The side emitting element 640 is flip-bonded to the lower surface of the package substrate 630 using solder bumps 644, 646 which electrically connect the side emitting element to the package substrate. The side emitting element 640 includes an active layer 642 for outputting an optical signal. The active layer 642 is aligned such that an output terminal of the active layer 642 is disposed oppositely to an input terminal 614 of the optical waveguide 612. Accordingly, the optical signal emitted from the active layer 642 is directly incident upon the optical waveguide 612.

The transmitting chip 660 is mounted on the upper surface of the printed circuit board 610 by means of solder balls 656, 658 laid respectively onto metal pads 626, 628 on the printed circuit board. The transmitting chip 660 is electrically connected to the printed circuit board 610 by means of the solder balls.

As apparent from the above description, the present invention provides a packaging apparatus for optical interconnection on an optical PCB, in which an optically active element is mounted on the lower surface of an opaque package substrate or the upper surface of a transparent package substrate. The manufacturing process is thereby simplified by alleviating the need for forming a hole through the package substrate.

Although preferred embodiments of the present invention have been described, those skilled in the art will appreciate that various modifications, additions, and substitutions to the specific elements are possible, without departing from the scope and spirit of the invention as disclosed in the accompanying claims.

What is claimed is:

1. A packaging apparatus for optical interconnection on an optical PCB comprising:
    a printed circuit board having an optical via hole, an upper surface, and an optical waveguide;
    an optical interconnection block of a hollow structure containing a cavity, the block having a reflective plane on lower end of the block and being inserted into the optical via hole;
    a package substrate mounted on said upper surface and having a lower surface; and
    an optically active element flip-bonded to said lower surface, optically aligned, by said reflective plane, with the optical waveguide and configured to optically communicate with the optical waveguide.

2. The packaging apparatus as set forth in claim 1, wherein the optically active element includes a surface emitting element.

3. The packaging apparatus as set forth in claim 2, further comprising a transmitting chip mounted on said upper surface for driving the surface emitting element.

4. The packaging apparatus as set forth in claim 2, further comprising a transmitting chip mounted on said lower surface for driving the surface emitting element.

5. A packaging apparatus for optical interconnection on an optical PCB comprising:
    a printed circuit board having an optical waveguide, an upper surface, a main via hole, and subsidiary via holes, the subsidiary via holes arranged around the main via hole;
    an optical interconnection block having a reflective plane on lower end of the block, the block being inserted into the main optical via hole;
    a package substrate mounted on said upper surface and having a lower surface;
    a plurality of guide pins extended from the package substrate and inserted into the subsidiary via holes; and
    an optically active element flip-bonded to said lower surface, optically aligned, by said reflective plane, with the optical waveguide, and configured to optically communicate with the optical waveguide.

6. The packaging apparatus as set forth in claim 5, wherein the optically active element includes a surface emitting element.

7. The packaging apparatus as set forth in claim 6, further comprising a transmitting chip mounted on said upper surface for driving the surface emitting element.

8. The packaging apparatus as set forth in claim 5, further comprising a plurality of interposers interposed between the package substrate and the printed circuit board for controlling an intervening interval.

9. The packaging apparatus as set forth in claim 8, wherein each of the interposers has a hollow-cylindrical shape defining a cavity such that a corresponding one of the guide pins passes through the respective cavity.

10. A packaging apparatus for optical interconnection on an optical PCB comprising:
    a printed circuit board having an optical via hole, an upper surface, and an optical waveguide;
    an optical interconnection block of a hollow structure containing a cavity, the block having a reflective plane on lower end of the block, and being inserted into the optical via hole;
    a package substrate mounted on said upper surface, having an upper surface, and made of a transparent material; and
    an optically active element flip-bonded to the upper surface of the package substrate, optically aligned, by said reflective plane, with the optical waveguide, and configure to optically communicate with the optical waveguide.

11. The packaging apparatus as set forth in claim 10, wherein the optically active element includes a surface emitting element.

12. The packaging apparatus as set forth in claim 11, further comprising a transmitting chip mounted on the upper surface of the printed circuit board for driving the surface emitting element.

13. The packaging apparatus as set forth in claim 10, wherein the package substrate has a lower surface, said apparatus further comprising a condensing lens bonded to said lower surface for improving optical coupling efficiency and reducing allowable alignment tolerance.

14. A packaging apparatus for optical interconnection on an optical PCB comprising:
    a printed circuit board having an optical waveguide, an upper surface, a main via hole, and subsidiary via holes, the subsidiary via holes arranged around the main via hole;
    an optical interconnection block having a reflective plane on lower end of the block, the block being inserted into the main optical via hole;
    a package substrate mounted on said upper surface and having an upper surface;
    a plurality of guide pins extended from the package substrate and inserted into the subsidiary via holes; and
    an optically active element flip-bonded to the upper surface of the package substrate and optically aligned, by said reflective plane, for optical communication by means of the optical waveguide.

15. The packaging apparatus as set forth in claim 14, wherein the optically active element includes a surface emitting element.

16. The packaging apparatus as set forth in claim 15, further comprising a transmitting chip mounted on the upper surface of the printed circuit board for driving the surface emitting element.

17. A packaging apparatus for optical interconnection on an optical PCB comprising:
- a printed circuit board having an optical via hole, an upper surface, and an optical waveguide;
- a package substrate flip-bonded to said upper surface and having a lower surface; and
- an optically active element flip-bonded to said lower surfaces having lateral surfaces, and provided with an active layer that extends from a first lateral surface to a second lateral surface of the optical active element and that is optically aligned with the optical waveguide disposed opposite to the first and second lateral surfaces, the optically active element being inserted into the optical via hole and configured to optically communicate with the optical waveguide.

18. The packaging apparatus as set forth in claim 17, wherein the optically active element includes a side emitting element.

19. The packaging apparatus as set forth in claim 18, further comprising a transmitting chip mounted onto said upper surface for driving the side emitting element.

20. The packaging apparatus as set forth in claim 19, wherein said transmitting chip has a lower surface connected to said upper surface by solder balls.

21. The packaging apparatus as set forth in claim 1, wherein the block being inserted into the optical via hole intersects with the optical waveguide.

22. The packaging apparatus as set forth in claim 5, wherein the block being inserted into the optical via hole intersects with the optical waveguide.

23. The packaging apparatus as set forth in claim 10, wherein the block being inserted into the optical via hole intersects with the optical waveguide.

24. The packaging apparatus as set forth in claim 14, wherein the block being inserted into the optical via hole intersects with the optical waveguide.

25. The packaging apparatus as set forth in claim 17, wherein the optical via hole intersects with the optical waveguide.

* * * * *